United States Patent [19]

Nagahara et al.

[11] Patent Number: 5,949,095
[45] Date of Patent: Sep. 7, 1999

[54] ENHANCEMENT TYPE MESFET

[75] Inventors: Masaki Nagahara; Yasunori Tateno; Masahiko Takikawa, all of Kawasaki, Japan

[73] Assignee: Fujitsu Limited, Kawasaki, Japan

[21] Appl. No.: 08/689,661

[22] Filed: Aug. 13, 1996

[30] Foreign Application Priority Data

Feb. 27, 1996 [JP] Japan .................................. 8-040160

[51] Int. Cl.⁶ .................................................. H01L 29/812
[52] U.S. Cl. ........................ 257/192; 257/268; 257/280; 257/631; 257/194
[58] Field of Search ................................ 257/280, 284, 257/192, 194, 631, 268–269

[56] References Cited

U.S. PATENT DOCUMENTS

| | | | |
|---|---|---|---|
| 4,503,600 | 3/1985 | Nii et al. | 257/284 |
| 4,641,161 | 2/1987 | Kim et al. | 257/192 |
| 4,656,076 | 4/1987 | Vetanen et al. | 428/137 |
| 4,733,283 | 3/1988 | Kuroda | 257/284 |
| 4,888,626 | 12/1989 | Davey | 257/283 |
| 5,043,777 | 8/1991 | Sriram | 257/284 |
| 5,411,914 | 5/1995 | Chen et al. | 257/192 |
| 5,445,979 | 8/1995 | Hirano | 438/167 |

FOREIGN PATENT DOCUMENTS

| | | | |
|---|---|---|---|
| 1-268071 | 10/1989 | Japan | 257/284 |
| 3-6834 | 1/1991 | Japan | 257/280 |

OTHER PUBLICATIONS

L. F. Eastman, "III–V Heterojunction Field Effect Transistor Using Indium Alloys," IEDM, !986, pp. 456–459.

N. C. Cirillo, Jr., et al., "Self Aligned Modulation–Doped(Al,Ga)As/GaAs Field Effect Transistors," IEEE Electron De vice Letters, Apr. 1984, pp. 129–131.

"0.15 $\mu$m Gate i–AlGaAs/n–GaAs HIGFET with a 13.3 S/Vcm K–Value", Matsumoto et al, *IEICE Transactions on Electronics*, vol. E76–C, Nr. 9, Sep. 1993, pp. 1373–1377.

"High–Breakdown–Voltage MESFET with a Low–Temperature–Grown GaAs Passivation Layer and Overlapping Gate Structure", Chen et al, *IEEE Electron Device Letters*, vol. 13, Nr. 6, Jun. 1992, pp. 335–337.

"High–Power and High–Efficiency GaAs MESFETs with Undoped GaAs layers on the Channels", Iwata et al, *NEC Research & Development*, vol. 33, Nr. 3, Jul. 1992, pp. 286–295.

"An $In_{0.52}Al_{0.48}As/n^+-In_xGa_{1-x}As$ Heterostructure Field–Effect Transistor with an In–Enriched Channel", Bahl et al, *Proceedings of the Indium Phosphide and Related Materials Conference*, Denver, Apr. 23–25 1990, vol. 1, Nr. Conf. 2, Apr. 1990, pp. 100–103.

"A Pseudomorphic $AlGaAs/n^+-InGaAs$ Metal–Insulator–Doped Channel FET for Broad–Band, Large–Signal Applications", Greenberg et al, *IEEE Electron Device Letters*, vol. 12, Nr. 8, Aug. 1991, pp. 436–438.

"Ion Implanted Confinement Layer for an InP/InGaAs/InP:Fe Heterojunction Field–Effect Transistor", Lauterbach et al, *Applied Physics Letters*, vol. 57, Nr. 5, Jul. 30, 1990, pp. 481–483.

*Primary Examiner*—John Guay
*Attorney, Agent, or Firm*—Nikaido, Marmelstein, Murray & Oram LLP

[57] ABSTRACT

A carrier transfer layer of compound semiconductor material is disposed on or over a support substrate, and a gate electrode of conductive material is disposed on or over the carrier transfer layer at a partial region thereof. A cap layer of non-doped compound semiconductor material is disposed on or over the carrier transfer layer at both sides of the gate electrode. The thickness of the cap layer is 100 nm or thicker. two current electrodes are formed in ohmic contact with the carrier transfer layer. An enhancement mode MESFET is provided whose gain and output power are suppressed from being lowered.

19 Claims, 7 Drawing Sheets

ENHANCEMENT TYPE MESFET

BACKGROUND OF THE INVENTION

1. Field of the Invention

The present invention relates to a semiconductor device, and more particularly to a MESFET (Metal-Semiconductor Field Effect Transistor) type semiconductor device.

2. Description of the Related Art

As mobile telephone and personal "handyphone" telephone systems (PHS) have recently become popular, low cost and compact radio apparatus for portable phones and base stations have become desirable. Conventional n-channel MESFETs in such devices are used in a depletion mode so that it is necessary to apply a positive bias to the drain electrode and a negative bias to the gate electrode. Therefore, positive and negative power sources are required, which results in an increase in size and weight of the devices.

In this context, it is desireable to replace depletion mode MESFETs with enhancement mode MESFETs, which do not require application of a negative bias to the gate electrode.

An enhancement mode MESFET can be achieved by depleting the whole thickness of an electron transfer layer under the gate electrode, under a condition where no voltage is applied to the gate electrode. If the electron transfer layer is thinned, however, the sheet resistance increases, and therefore the gain and output power lowers. Furthermore, as a positive voltage is applied during the enhancement operation, a gate leak current increases so that a large saturation drain current is impossible and the output power is lowered.

Because of these significant problems, enhancement mode MESFETs have not been put into practical use.

SUMMARY OF THE INVENTION

It is an object of the present invention to provide an enhancement mode MESFET capable of preventing a gain and output power from being lowered.

First, a description will be provided for the reason why the sheet resistance of a carrier transfer layer of an enhancement mode MESFET becomes high.

As noted previously, the thickness of a carrier transfer layer of an enhancement mode MESFET whose gate electrode does not require a negative bias necessarily becomes relatively thin in order to form the depletion layer through the whole thickness of the carrier transfer layer under a condition that a voltage is not applied to the gate electrode. Also, since the source and drain regions connected to the carrier transfer layer are generally formed spaced apart from the gate electrode in order to avoid a short-circuit to the gate electrode, the sheet resistance of the carrier transfer layer in the spaced regions (at both sides of the gate electrode) is substantially constant irrespective of the potential of the gate electrode, because the depletion layer in these spaced regions cannot be controlled by the gate electrode.

Therefore, the carrier transfer layer is relatively thin, and the current path in the spaced regions becomes narrow in correspondence with the depletion layer permeating through the spaced regions, and the sheet resistance of the whole carrier transfer layer becomes high, corresponding to the narrowed current path.

According to one aspect of the present invention, a semiconductor device comprises a support substrate, and a carrier transfer layer of compound semiconductor material is disposed on the support substrate. A gate electrode is disposed on the carrier transfer layer at a partial region thereof. A cap layer of non-doped compound semiconductor material is disposed on the carrier transfer layer at both sides of the gate electrode, with the cap layer having a thickness of 100 nm or thicker. Two current electrodes are in ohmic contact with the carrier transfer layer.

The cap layer of 100 nm or thicker is thicker than the thickness of a depletion layer extending from the upper surface of the cap layer toward the lower level carrier transfer layer. Therefore, either the depletion layer does not reach the carrier transfer layer or the depth of the depletion layer permeating through the carrier transfer layer is reduced. The sheet resistance of the carrier transfer layer can therefore be reduced.

Accordingly, even if the carrier transfer layer is made so thin that the whole thickness of the carrier transfer layer under the gate electrode can be depleted when no voltage is applied to the gate electrode of an enhancement mode MESFET, an increase of the sheet resistance of the carrier transfer layer can be prevented.

According to another aspect of the present invention, the semiconductor device further comprises a gate contact layer of compound semiconductor material having a band gap larger than the band gap of the carrier transfer layer. The gate contact layer is disposed between the carrier transfer layer and the gate electrode.

As the band gap of the gate contact layer is made large, the potential barrier between the gate contact layer and the carrier transfer layer becomes large; as a result, a gate leakage current can be reduced.

According to another aspect of the present invention, the gate electrode of the semiconductor device has side walls facing the cap layers, and the cap layers are in contact with the side walls of the gate electrode.

The carrier transfer layer at the regions between the source electrode and gate electrode and between the drain electrode and gate electrode is covered with the cap layer. Therefore, at these regions, the formation of a depletion layer can be prevented.

According to a further aspect of the present invention, the semiconductor device further comprises a relaxation layer of non-doped compound semiconductor material which is the same as the carrier transfer layer. The relaxation layer is disposed between the carrier transfer layer and the gate contact layer. This relaxation layer prevents surface roughness at the interface between the carrier transfer layer and the gate contact layer.

According to yet another aspect of the invention, the semiconductor device further comprises a spacer layer of non-doped compound semiconductor material disposed between the gate contact layer and the cap layer. An etching stopper layer is disposed between the spacer layer and the cap layer, and has a different etching rate from the etching rates of the spacer layer and the cap layer. The gate electrode is disposed in contact with the spacer layer. Selective etching of the cap layer can be automatically stopped by the etching stopper layer. In a post-process, the damaged etching stopper layer can be removed to expose the spacer layer. The gate electrode is formed on the surface of the spacer layer while avoiding surface roughness of the gate contact layer.

According to another aspect of the present invention, a semiconductor device comprises a support substrate and a carrier transfer layer disposed on the support substrate. The carrier transfer layer is made of compound semiconductor material containing impurities for imparting conductivity. A gate electrode is disposed on the carrier transfer layer at a partial region thereof. A source region and a drain region are electrically connected to the carrier transfer layer. The source and drain regions are disposed at both sides of the gate electrode and spaced from the gate electrode. A cap region of compound semiconductor material disposed on the carrier transfer layer at regions between the gate electrode and the source and drain regions. The cap region has a thickness equal to, or larger than, the thickness of a surface depletion layer extending from the upper surface of the cap region into the inside thereof.

With this structure, the cap regions disposed between the gate electrode and the source and drain regions prevent the depletion layer from permeating through the carrier transfer layer. Therefore, an increase of the sheet resistance of the carrier transfer layer at these regions can be prevented, and the sheet resistance can therefore be reduced.

BRIEF DESCRIPTION OF THE DRAWINGS

For a more detailed understanding of the preferred embodiments of the present invention, reference should be made to the appended drawings wherein.

DETAILED DESCRIPTION OF THE PREFERRED EMBODIMENTS:

The present inventors quantitatively analyzed the structure and characteristics of MESFETs, with a goal of manufacturing enhancement mode MESFETs having the advantage discussed above.

Figure 4:
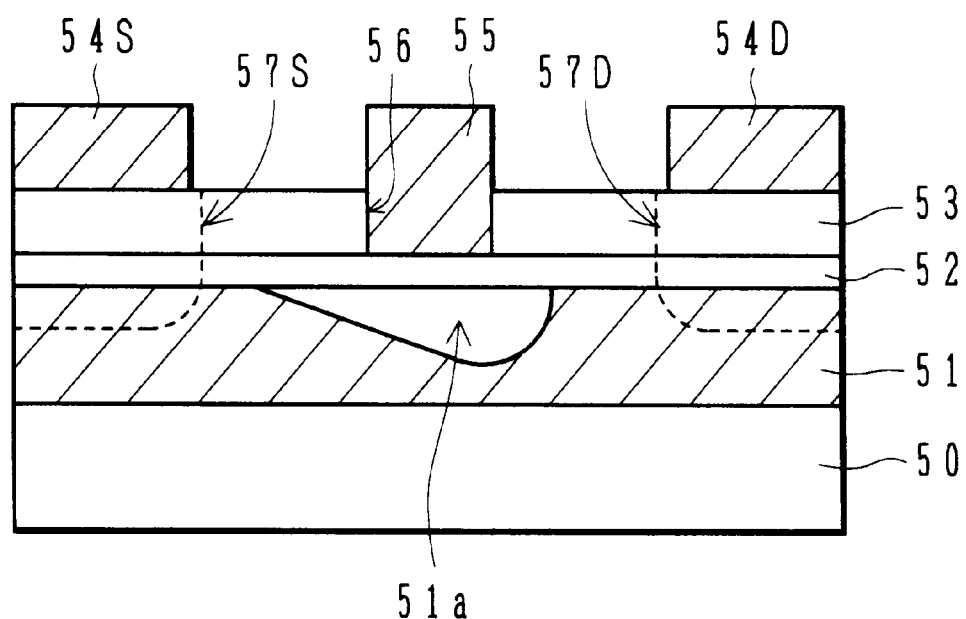
FIG. 4 is a cross sectional view of a MESFET used for quantitative analyses.

FIG. 4 is a cross sectional view of a MESFET used for the quantitative analysis. A semi-insulating GaAs substrate 50 has an electron transfer layer 51 made of n-type impurity doped GaAs and formed on the surface of the substrate 50, and a gate contact layer 52 made of non-doped AlGaAs and a cap layer 53 made of non-doped GaAs respectively laminated over the electron transfer layer 51.

A recess 56 is formed in the cap layer 53 at its partial region, the recess reaching the upper surface of the gate contact layer 52. The recess 56 is completely filled with a gate electrode 55 made of conductive material. A source electrode 54S and a drain electrode 54D are formed on the surface of the cap layer 53 at both sides of the gate electrode, the source and drain electrodes having a two layer structure of AuGe/Au (a notation A/B indicates a lamination of a lower level A layer and a higher level B layer).

Under the source and drain electrodes 54S and 54D, impurity ions are doped from the cap layer 53 to the upper surface layer of the electron transfer layer 51 to form low resistance regions 57S and 57D. The regions near the interface between the source and drain electrodes 54S and 54D and the cap layer 53 are alloyed by heat treatment after the electrodes are formed. These low resistance regions 57S and 57D make the source and drain electrodes 54S and 54D in ohmic contact with the electron transfer layer 51.

Under the condition that no voltage is applied to the gate electrode 55, at least the upper layer of the electron transfer layer 51 under the gate electrode 55 is depleted and a depletion layer 51 a is formed. If this depletion layer 51a extends only to the upper layer of the electron transfer layer 51, a current path between the drain and source is formed under this upper layer. Therefore, the MESFET becomes a depletion mode type. If the depletion layer 51a extends through the whole thickness of the electron transfer layer 51, a current path between the source and drain is not formed, so that the MESFET becomes an enhancement mode type.

The depletion layer means a depleted depth region from the surface of a semiconductor layer or from the interface between a semiconductor layer and another layer to the depth where a slope of the energy band structure becomes zero.

Figure 5A:
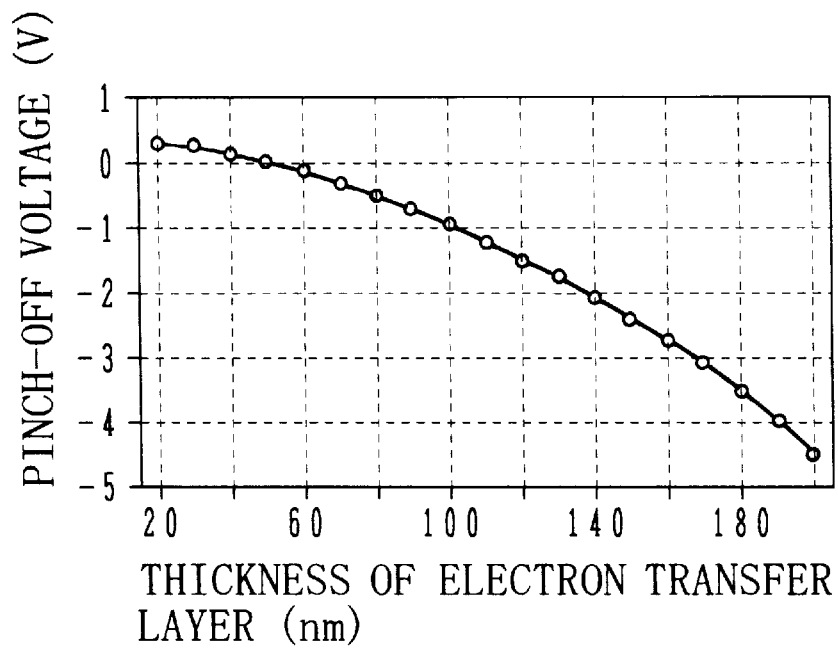
FIG. 5A is a graph showing a pinch-off voltage of the MESFET shown in FIG. 4 as a function of a thickness of an electron transfer layer.

FIG. 5A shows the relationship between a thickness of the electron transfer layer 51 of MESFET shown in FIG. 4 and a pinch-off voltage. The pinch-off voltage is defined by a gate bias voltage when the depletion layer traverses through the electron transfer layer. The abscissa represents a thickness of the electron transfer layer 51 in nm, and the ordinate represents a pinch-off voltage. The pinch-off voltage was calculated by a one dimensional Poisson's equation with regard to the thickness direction. The pinch-off voltage is equal to the gate electrode voltage applied when the thickness of the electron transfer layer 51 becomes equal to that of the depletion layer 51a. The impurity concentration of the electron transfer layer 51 was $1.5 \times 10^{17}$ cm$^{-3}$, the composition ration of Al in the gate contact layer 52 was 0.2, and the thickness thereof was 35 nm.

As shown in FIG. 5A, as the electron transfer layer 51 becomes thicker, the pinch-off voltage monotonously lowers (increases in the negative direction). With the electron transfer layer 51 about 50 nm thick, the pinch-off voltage becomes 0 V, and as it becomes thinner, the pinch-off voltage becomes positive. It can therefore be understood that when the electron transfer layer 51 is made thinner than 50 nm, an enhancement mode MESFET can be obtained.

Figure 5B:
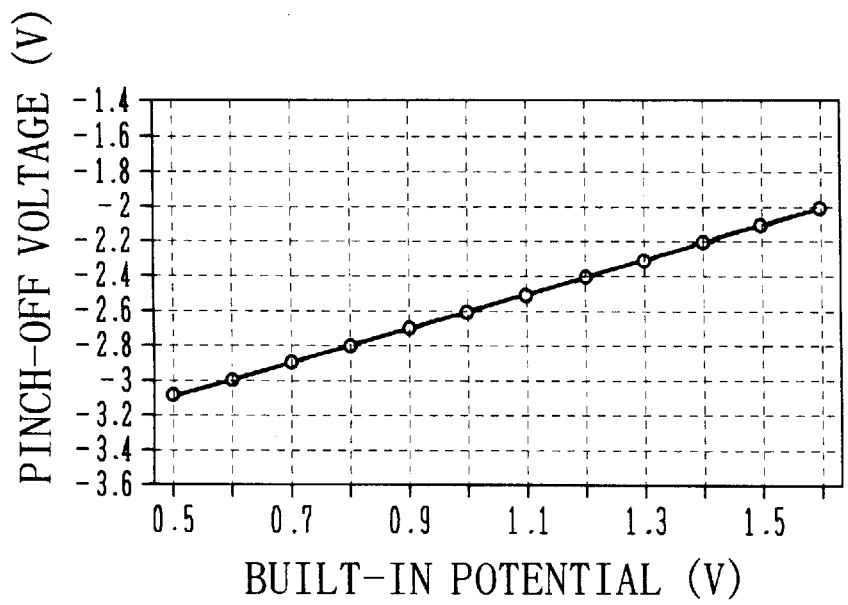
FIG. 5B is a graph showing the pinch-off voltage as a function of built-in potential.

FIG. 5B shows the relationship between the pinch-off voltage and a built-in potential at the interface between the gate electrode 55 and gate contact layer 52 of MESFET shown in FIG. 4. The abscissa represents a built-in potential, and the ordinate represents a pinch-off voltage. The pinch-off voltage was calculated in the same manner as described in FIG. 5A. The impurity concentration of the electron transfer layer was $1.5 \times 10^{17}$ cm$^{-3}$, the thickness thereof was 150 nm, and the gate contact layer 52 was 35 nm.

As shown in FIG. 5B, as the built-in potential rises, the pinch-off voltage rises. Although the negative pinch-off voltage region is shown, it can be expected that an enhancement mode MESFET can be obtained by raising the built-in potential. This is due to the fact that there is a tendency that as the built-in potential rises, the pinch-off voltage also rises.

The built-in potential changes with the composition ratio of Al in the gate contact layer 52, and as the composition ratio of Al increases, the built-in potential rises. Accordingly, it can be expected that an enhancement mode MESFET can be obtained by increasing the composition ratio of Al in the gate contact layer 52.

Next, with reference to FIG. 6A, the relationship between the thickness of the electron transfer layer and the impurity concentration will be described.

If the electron transfer layer 51 is made thin in order to realize the enhancement mode of the MESFET, the sheet resistance of the electron transfer layer 51 becomes high. In order to suppress an increase of the sheet resistance, it is effective that a high impurity concentration be provided for the electron transfer layer 51.

Figure 6A:
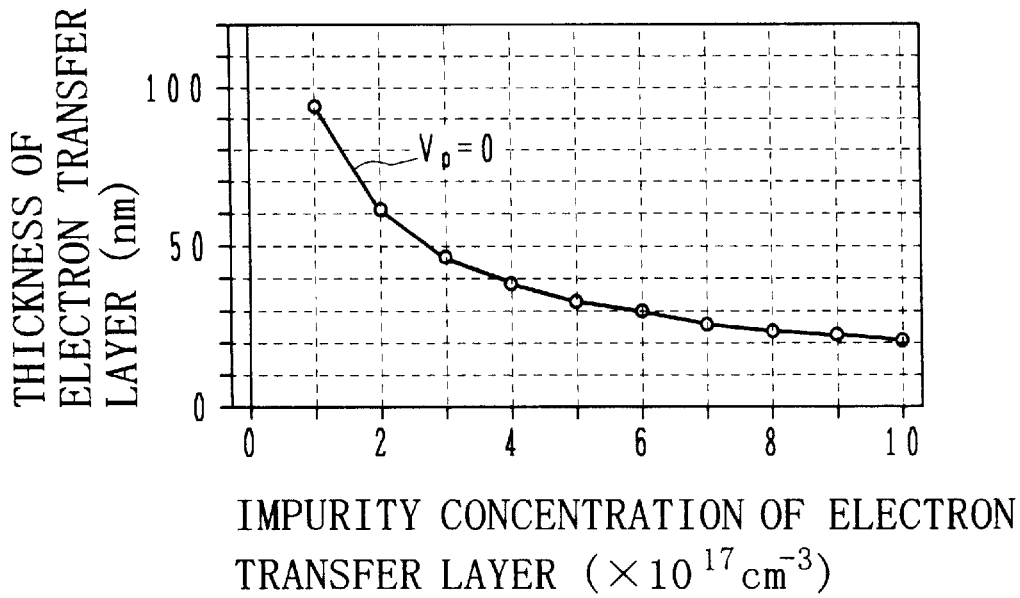
FIG. 6A is a graph showing as a function of an impurity concentration a thickness of the electron transfer layer of the MESFET shown in FIG. 4 which thickness makes the pinch-off voltage 0 V.

FIG. 6A shows the relationship between the impurity concentration and thickness of the electron transfer layer 51, when the pinch-off voltage Vp of the MESFET shown in FIG. 4 becomes 0 V. The abscissa represents an impurity concentration in cm$^{-3}$, and the ordinate represents a thickness of the electron transfer layer 51 in nm. The polygonal lines shown in FIG. 6A indicates the impurity concentration and thickness of the electron transfer layer 51 when the pinch-off voltage Vp becomes 0 V. The MESFET takes the enhancement mode in the region under the polygonal line, and takes the depletion mode in the upper region.

As shown in FIG. 6A, the polygonal line giving the pinch-off voltage of 0 V has a slope lowering to the right. Specifically, if the impurity concentration is increased while the thickness of the electron transfer layer 51 is maintained constant, the mode changes from the enhancement mode to the depletion mode at a cross point of the polygonal line. Therefore, in order to prevent an increase of the sheet resistance of the thinned electron transfer layer 51 while retaining the enhancement mode, the impurity concentration is set lower than the polygonal line of FIG. 6A, preferably near the polygonal line.

Next, with reference to FIG. 6B, the relationship between the impurity concentration and a saturation drain current will be described.

Figure 6B:
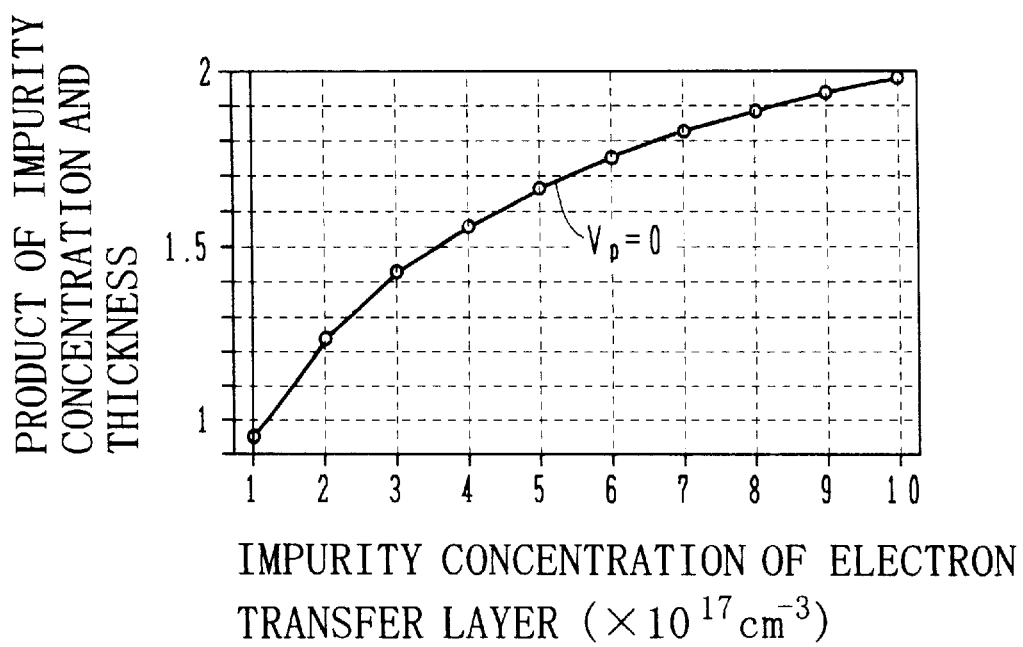
FIG. 6B is a graph showing as a function of an impurity concentration a product of the impurity concentration and the thickness of the electron transfer layer of the MESFET shown in FIG. 4 which product makes the pinchoff voltage 0 V.

FIG. 6B is a graph showing a product of the impurity concentration and thickness of the electron transfer layer 51 when the pinch-off voltage Vp becomes 0 V, as a function of the impurity concentration. The abscissa represents an impurity concentration of the electron transfer layer 51 in cm$^{-3}$ and the ordinate represents a product of the impurity concentration and thickness. The constitution of the MESFET is the same as that shown in FIG. 6A.

As the impurity concentration of the electron transfer layer 51 is increased, the product of the impurity concentration and thickness when the pinch-off voltage becomes 0 V also increases. The saturation drain current can be correlated with the product of the impurity concentration and thickness, and as the product increases, the saturation drain current increases. Therefore, as the impurity concentration of the electron transfer layer 51 is increased while maintaining the condition that the pinch-off voltage becomes 0 V, the saturation drain current increases. Namely, even if the electron transfer layer 51 is made thin, if the impurity concentration is increased correspondingly, not only the saturation drain current can be prevented from being lowered, but also a larger saturation drain current can be obtained.

Next, the relationship will be described between the thickness of a cap region directly formed on the electron transfer layer and the sheet resistance of the electron transfer layer of the MESFET.

Figure 7A:
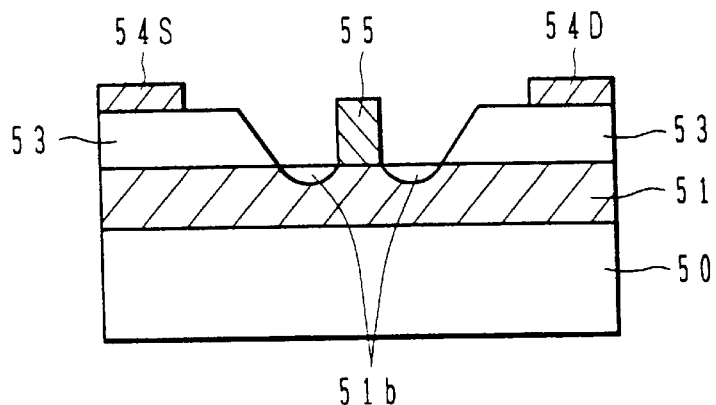
FIG. 7A is a cross sectional view of a recess type MESFET.

FIG. 7A is a cross sectional view of a conventional recess type MESFET having an exposed surface of an electron transfer layer at both sides of the gate electrode. In the MESFET shown in FIG. 4, the gate contact layer 52 is disposed between the electron transfer layer 51 and the gate electrode 55. In the MESFET shown in FIG. 7A, however, the gate electrode 55 is directly formed on the surface of the electron transfer layer 51 to use Schofttky contact. The other structures are the same as the MESFET shown in FIG. 4.

In the MESFET shown in FIG. 7A, a gap is formed between a cap layer 53 and the gate electrode 55. The surface of the electron transfer layer 51 exposes in this gap.

A surface depletion layer 51b is formed in the surface layer of the exposed electron transfer layer 51. This surface depletion layer 51b reduces the effective thickness of the electron transfer layer 51 and increases the resistance between the source and drain.

Figure 7B:
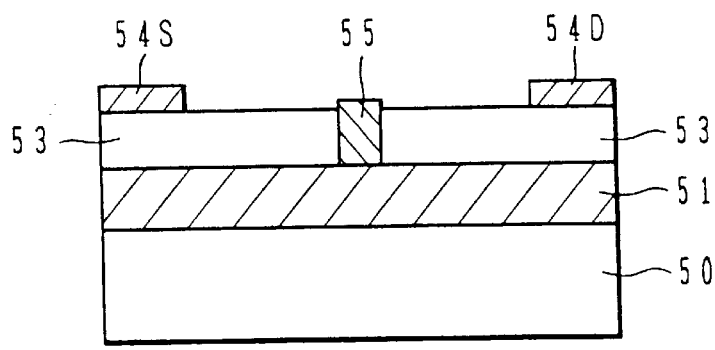
FIG. 7B is a cross sectional view of an embedded type MESFET.

FIG. 7B is a cross sectional view of an embedded gate type MESFET having an electron transfer layer covered with a cap layer at both sides of the gate electrode. The gate electrode 55 completely fills a recess formed in the cap layer 53 which is in contact with the side walls of the gate electrode. Therefore, the surface of the electron transfer layer near the side walls will not be exposed but covered with the cap layer 53 so that a surface depletion layer is hard to be formed in the surface layer of the electron transfer layer 51. The thickness of a depletion layer formed at the interface between the electron transfer layer 51 and cap layer 53 depends on the thickness of the cap layer 53.

Figure 7C:
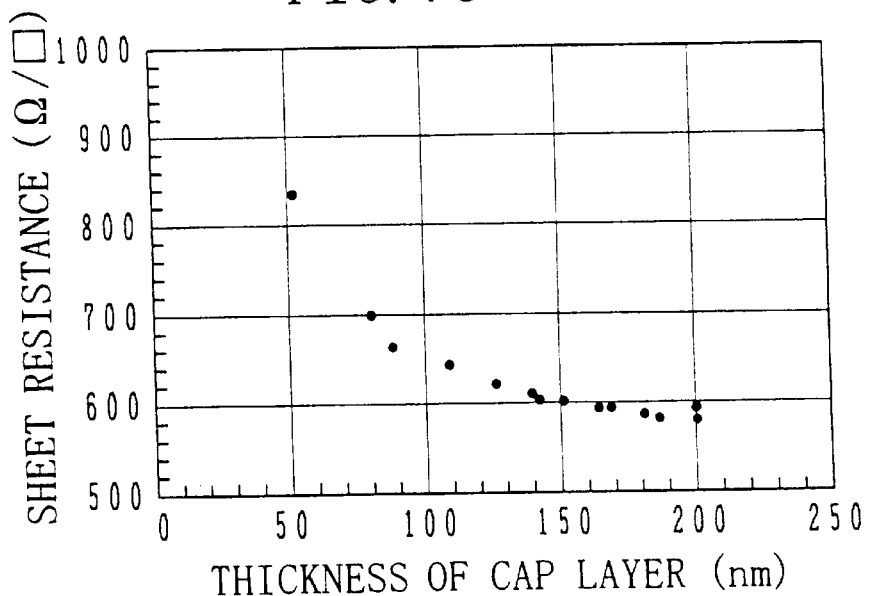
FIG. 7C is a graph showing a sheet resistance of an electron transfer layer as a function of a thickness of a cap layer formed on the electron transfer layer.

FIG. 7C is a graph showing the sheet resistance of an electron transfer layer as a function of the thickness of a cap layer formed on the electron transfer layer. The abscissa represents a thickness of the cap layer in nm and the ordinate represents a sheet resistance in $\Omega/\square$. The electron transfer layer was made of GaAs, the thickness thereof was 46 nm, the impurity concentration thereof was $1 \times 10^{18}$ cm$^{-3}$, and the cap layer was made of GaAs.

As shown in FIG. 7C, as the cap layer is made thin, the sheet resistance increases. As the cap layer is made thinner than 100 nm, the sheet resistance increases greatly.

The sheet resistance decreases as the cap layer is made thick due to the fact that because of a presence of the cap layer, the surface depletion layer in the cap layer terminates intermediately of the whole thickness of the cap layer and does not substantially reach the carrier transfer layer.

It is therefore preferable to set the thickness of the cap layer to 100 nm or thicker in order to suppress an increase of the sheet resistance to be otherwise caused by the surface depletion layer, and it can be understood from FIG. 7C that the thickness is more preferably set to 130 nm or thicker. This conclusion assumes the cap region covering the surface of the carrier transfer layer is a single layer. The cap region is not limited only to a single cap layer but may be formed by a plurality of layers by interposing other semiconductor layers between the cap layer and the carrier transfer layer. In this case, if the cap layer is made thicker than 100 nm or more, the surface depletion layer can be positioned to be sufficiently remote from the carrier transfer layer, so that the effects of the cap region cannot be lowered.

The gate contact layer 52 described with FIG. 4 is used for increasing the extension of the depletion layer formed just under the gate electrode (increasing the permeation depth of the depletion layer through the carrier transfer layer). This gate contact layer at the regions between the gate electrode and the source and drain regions may function as the cap region.

Specifically, the thickness of the gate contact layer functioning as the cap region may be made thicker than the region just under the gate electrode. With this thickness, the surface depletion layer formed in the gate contact layer at the cap region terminates intermediately of the whole depth of the gate contact layer and does not substantially reach the carrier transfer layer. In this manner, an increase of the sheet resistance can be eliminated even if the cap layer 53 is not formed or the cap layer 53 has such a thickness (e.g., 100 nm or thinner) as the depletion layer does not terminate intermediately of the whole depth region of the cap layer 53.

In short, an increase of the sheet resistance can be avoided by forming the semiconductor cap region on the carrier transfer layer at the regions between the gate electrode and the source and drain regions, the semiconductor cap region having such a thickness as the surface depletion layer terminates intermediately of the whole depth of the cap region inclusive of the gate contact layer and does not substantially reach the carrier transfer layer.

Next, the first embodiment of the invention will be described with reference to FIGS. 1 and 2.

Figure 1:
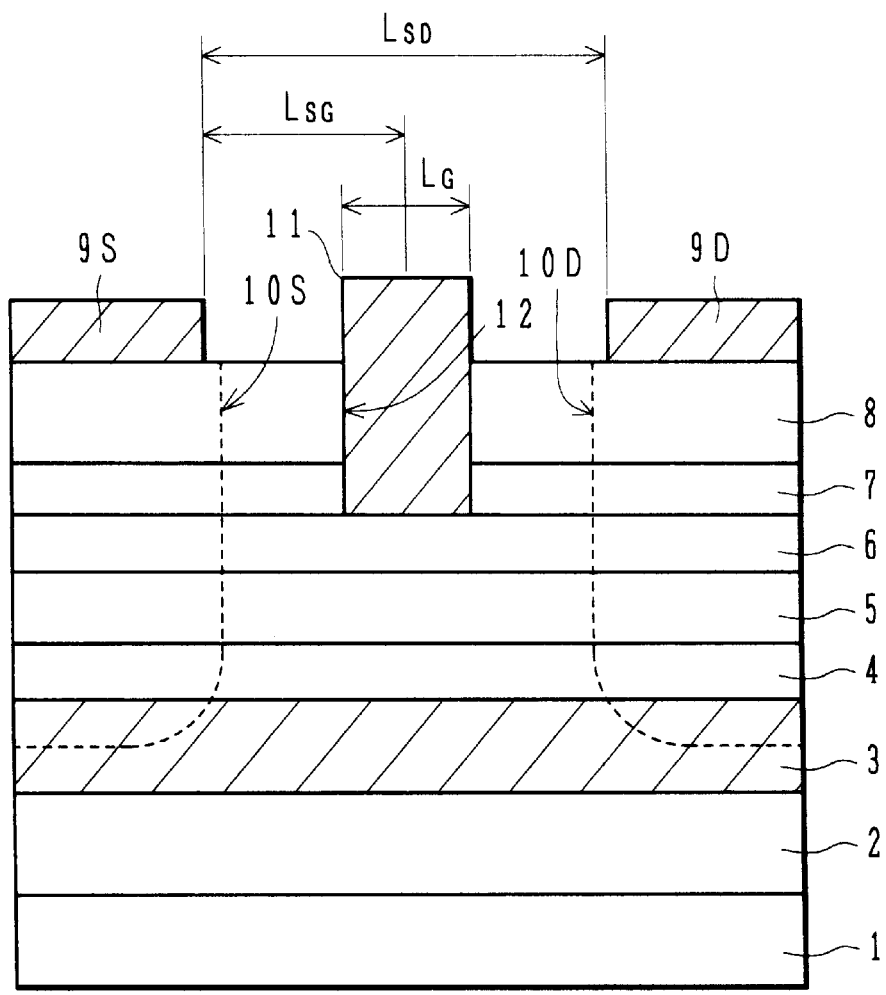
FIG. 1 is a cross sectional view of a MESFET according to a first embodiment of the invention.

FIG. 1 is a cross sectional view showing the structure of a MESFET of the first embodiment. In the following, a MESFET manufacturing method will be described.

On a semi-insulating GaAs substrate 1, a buffer layer 2, an electron transfer layer 3, a relaxation layer 4 for suppressing roughness at the interface between the layers 3 and 5, a gate contact layer 5, an etching stopper layer 7, and a cap layer 8 are sequentially laminated in this order by a molecular beam epitaxy (MBE) process. The substrate temperature during the expitaxial growth is approximately 630° C.

The buffer layer 2 is made of non-doped GaAs and is 500 nm thick. The electron transfer layer 3 is made of Si doped n-type GaAs having an impurity concentration of $1 \times 10^{18}$ $cm^{-3}$ and is 20 nm thick. The relaxation layer 4 is made of non-doped GaAs and is 5 nm thick. The gate contact layer 5 is made of non-doped $Al_{0.5}Ga_{0.5}As$ and is 20 nm thick.

The spacer layer 6 is made of non-doped GaAs and is 5 nm thick. The etching stopper layer 7 is made of non-doped $Al_{0.5}Ga_{0.5}As$ and is 5 nm thick. The cap layer 8 is made of non-doped GaAs and is 130 nm thick.

Next, a resist pattern is formed having openings at the regions corresponding to those where source and drain electrodes are formed. By using this resist pattern as a mask, Si ions are implanted under the conditions of, for example, an acceleration energy of 150 to 175 keV and a dose of $1 \times 10^{13}$ $cm^{-2}$. The implanted Si atoms are activated by heat treatment for 20 minutes at 850° C. In this manner, low resistance regions 10S and 10D are formed at the regions corresponding to those where the source and drain electrodes are formed, the low resistance regions 10S and 10D extending from the cap layer 8 down into the surface layer of the electron transfer layer 3.

Without removing the resist pattern used as the mask, a lamination of AuGe/Au is deposited by vapor deposition. For example, the AuGe layer is 50 nm thick and the Au layer is 300 nm. Thereafter, the resist pattern and the AuGe/Au layer deposited thereon are removed. in this manner, a source electrode 9S and a drain electrode 9D are formed. In this embodiment, the distance $L_{SD}$ between the source and drain electrodes 9S and 9D is set to 4 µm.

The interfaces between the cap layer 8 and the source and drain electrodes 9S and 9D are alloyed through heat treatment for about 2 minutes at a temperature of 450° C. in an $N_2$ atmosphere.

A resist pattern is formed having an opening at the region corresponding to a gate electrode forming region between the source and drain electrodes 9S and 9D. By using this resist pattern as a mask, the cap layer 8 is etched by reactive ion etching (RIE) using $SiCl_4+SF_6$ as etching gas. This etching gas scarcely etches AlGaAs so that the etching in the depth direction stops when the upper surface of the etching stopper layer 7 made of AlGaAs is exposed.

By wet etching using $HNO_3$, the etching stopper layer 7 at the exposed region is post-processed. $HNO_3$ removes the etching stopper layer 7 damaged by the dry etching and exposes the surface of the spacer layer 6. In this manner, a recess 12 is formed extending to the upper surface of the spacer layer 6.

Without removing the resist pattern used as the etching mask, an Al layer is vapor deposited to a thickness of 300 nm. Thereafter, the resist pattern and the Al layer vapor deposited thereon are removed. In this manner, a gate electrode 11 of Al completely filling the recess 12 is formed. In this embodiment, the distance $L_{SG}$ between the end of the source electrode 9S on the gate electrode side and the center of the gate electrode 11 is set to 1.5 µm and the gate length $L_G$ is set to 0.9 µm.

Figure 2:
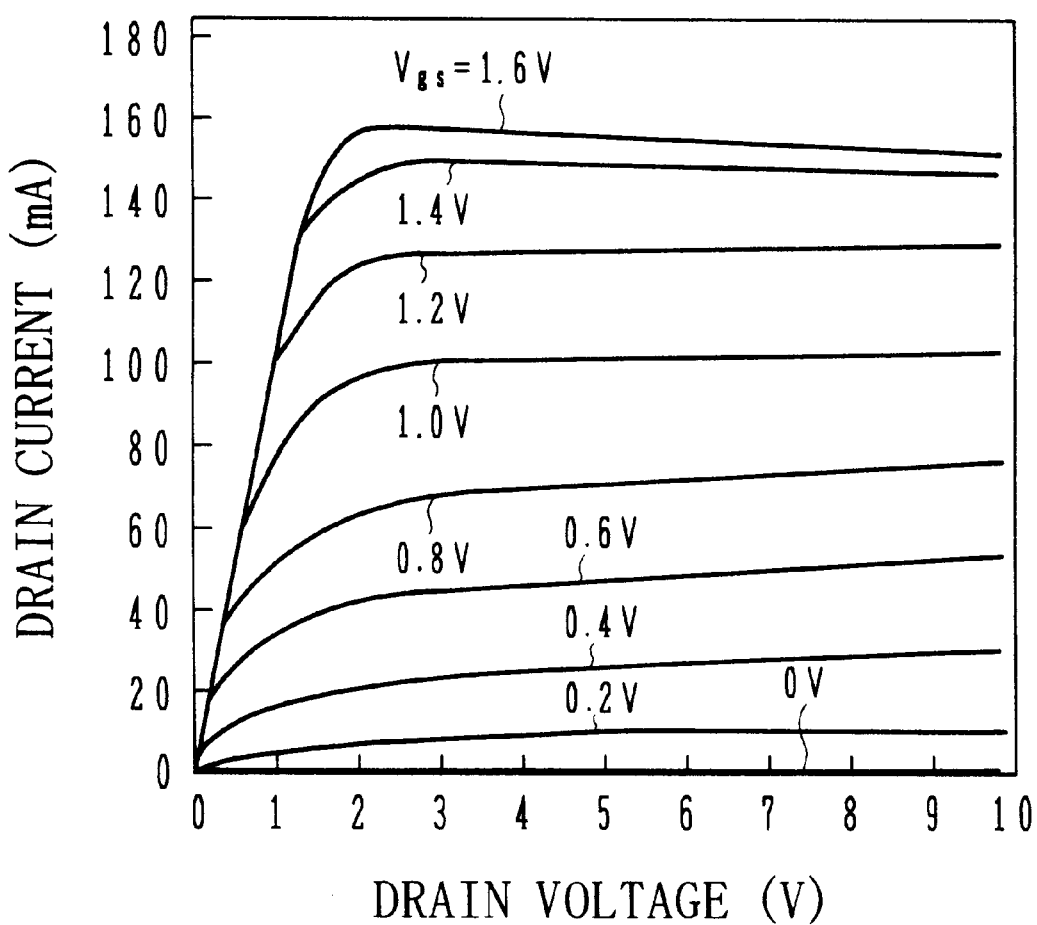
FIG. 2 is a graph showing the voltage-current characteristics of MESFET shown in FIG. 1.

FIG. 2 shows the current-voltage characteristics of MESFET shown in FIG. 1. The abscissa represents a drain voltage and the ordinate represents a drain current in mA. A gate voltage is indicated at each curve of FIG. 2. Almost no drain current flows at the gate voltage of 0 V. It is therefore understood that the MESFET takes the enhancement mode. As the gate voltage increases, the saturation drain current increases. The saturation drain current is about 160 mA at the gate voltage of 1.6 V.

Since the thickness of the cap layer 8 of the MESFET shown in FIG. 1 is 130 nm, it can be expected that an increase of the sheet resistance of the electron transfer layer 3 is prevented as discussed above with respect to FIG. 7C. Furthermore, since the cap layer 8 is in contact with the side walls of the gate electrode 11, a surface depletion layer such as that shown in FIG. 7A is prevented from being formed at both sides of the gate electrode.

The Al composition ratio of the gate contact layer 5 made of AlGaAs is set to 0.5. This Al composition ratio of the gate contact layer 5 has been conventionally set to about 0.2. By increasing the Al composition ratio, the built-in potential at the interface between the gate electrode 11 and gate contact layer 5 can be raised. As discussed with FIG. 5B, as the built-in potential is raised, the pinch-off voltage rises and the gate leak current at a positive gate voltage can be reduced. Therefore, raising the built-in potential is effective for the manufacture of an enhancement mode MESFET. The similar effects can be expected at the composition ratio of 0.4 to 1.0 of Al in the gate contact layer.

The relaxation layer 4 suppresses roughness of the interface between the electron transfer layer 3 and gate contact layer 5.

The etching stopper layer 7, having an etching rate different from both the spacer layer 6 and cap layer 8, is formed on the spacer layer 6 on the gate contact layer 5. Provision of this etching stopper layer 7 facilitates control of the depth of the recess 12.

In the first embodiment, the source-drain electrode distance $L_{SD}$ of the MESFET shown in FIG. 1 is set to 4 μm. In order to improve the drain efficiency of MESFET, it is preferable to set the source-drain electrode distance $L_{SD}$ to 4 μm or shorter. Also the distance $L_{SG}$ between the source electrode and the center of the gate electrode is set to 1.5 μm. In order to obtain good mutual conductance, this distance $L_{SG}$ is preferably set to 1.5 μm or less.

Figure 3A:
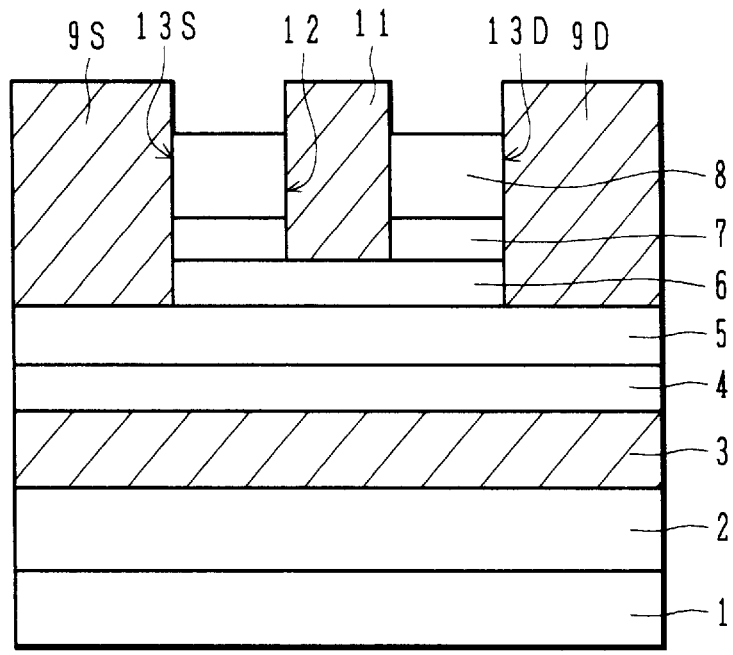
FIGS. 3A and 3B are cross sectional views of a MESFET according to a second embodiment of the invention, and of a modified MESFET.

FIG. 3A is a cross sectional view of the MESFET according to the second embodiment of the invention. For the MESFET shown in FIG. 1, the source and drain electrodes 9S and 9D are formed on the cap layer 8. In contrast, for the MESFET shown in FIG. 3A, recesses 13S and 13D are formed extending from the cap layer 8 down to the bottom layer of the spacer layer 6 to expose the top source of the gate contact layer 5, so that the source and drain electrodes 9S and 9D are formed in direct contact with the gate contact layer 5.

For the MESFET shown in FIG. 1, the Si doped low resistance regions 10S and 10D make the electron transfer layer 3 in ohmic contact with the source and drain regions 9S and 9D. In contrast, for the MESFET shown in FIG. 3A, there are only the relaxation layer 4 and gate contact layer 5 between the electron transfer layer 3 and the source and drain electrodes 9S and 9D, so that ohmic contact can be established by alloying only the lower regions under the source and drain electrodes 9S and 9D. The other structures are similar to the MESFET shown in FIG. 1.

In the following, a manufacturing method for the MESFET shown in FIG. 3A will be described, while paying attention to different points from the manufacture method for the MESFET shown in FIG. 1.

As a substitute for the process of implanting Si ions to form the low resistance regions 10S and 10D shown in FIG. 1, a resist pattern is formed having openings at the regions corresponding to the regions where the source and drain electrodes 9S and 9D are formed. Through these openings, the cap layer 8, etching stopper layer 7, and spacer layer 6 are etched to form recesses 13S and 13D. The etching conditions for the cap layer 8 and etching stopper layer 7 are similar to the conditions of forming the recess 12 of FIG. 1. The etching conditions for the spacer layer 6 are similar to the etching conditions for the cap layer 8.

Without removing the resist pattern used as the etching mask, a lamination of AuGe/Au is deposited by vapor deposition. Thereafter, through lift-off, the source and drain electrodes 9S and 9D are formed. Heat treatment is performed for 2 minutes at a temperature of 450° C. under an $N_2$ atmosphere to alloy the regions under the source and drain electrodes 9S and 9D.

The other processes are similar to those described above with respect to FIG. 1.

In the MESFET shown in FIG. 3A, the alloyed regions make the electron transfer layer 3 in ohmic contact with the source and drain electrodes 9S and 9D. In contrast, in the MESFET shown in FIG. 1, the low resistance regions 10S and 10D formed through the gate contact layer 5 make the electron transfer layer 3 in ohmic contact with the source and drain electrodes 9S and 9D.

The composition ratio of Al in the gate contact layer 5 made of AlGaAs is about 0.5. With such a relatively high Al composition ratio, implanted Si atoms become difficult to be activated. Therefore, it is difficult to lower the contact resistance between the electron transfer layer 3 and the source and drain electrodes 9S and 9D.

As shown in FIG. 3A, by contacting the electron transfer layer 3 and the source and drain electrodes 9S and 9D by the alloyed regions, the contact resistance between the electron transfer layer 3 and the source and drain electrodes 9S and 9D can be lowered.

Figure 3B:
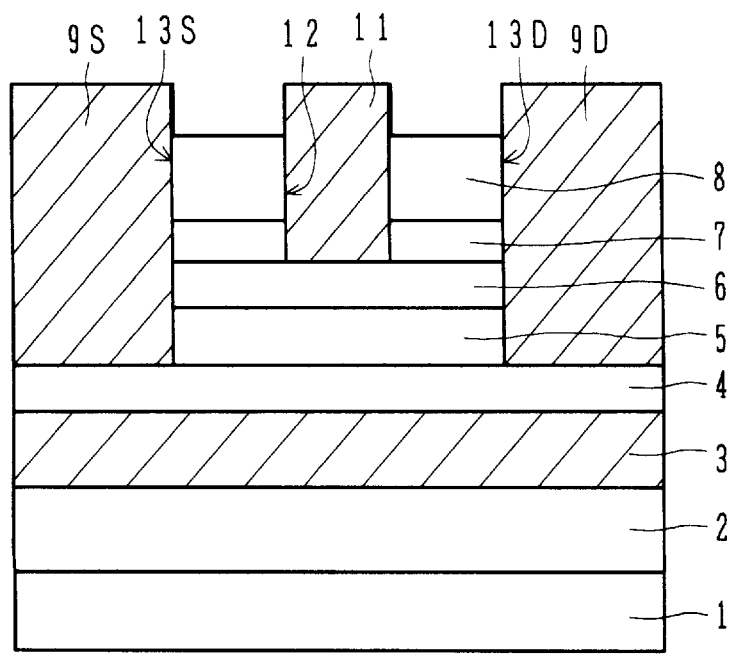

FIG. 3B shows a modification of the MESFET of the second embodiment shown in FIG. 3A. For the MESFET shown in FIG. 3A, the source and drain electrodes 9S and 9D are formed to contact the gate contact layer 5. However, for the MESFET shown in FIG. 3B, the source and drain electrodes 9S and 9D are made in contact with the relaxation layer 4. The other structures are similar to the MESFET shown in FIG. 3A.

Also in the structure shown in FIG. 3B, the electron transfer layer 3 and the source and drain electrodes 9S and 9D are connected by ohmic contacts without using the Si doped regions formed through the gate contact layer 5. Therefore, an increase of the contact resistance between the electron transfer layer 3 and the source and drain electrodes 9S and 9D can be suppressed.

In the MESFET shown in FIG. 3B, the source and drain electrodes 9S and 9D are in contact with the relaxation layer 4. If the relaxation layer 4 is not formed or in other cases, they may be made in direct contact with the electron transfer layer 3.

In the first and second embodiments, a GaAs substrate is used; the electron transfer layer 3, relaxation layer 4, spacer layer 6, and cap layer 8 are made of GaAs, and the gate contact layer 5 and etching stopper layer are made of AlGaAs. Other materials may be used as substitutes.

For example, in the case of a GaAs substrate, other materials may be InGaAs for the electron transfer layer 3, InGaAs or GaAs for the relaxation layer 4, AlGaAs for the gate contact layer 5 and etching stopper layer 7, and GaAs for the spacer layer 6 and cap layer 8. In the case of an InP substrate, other materials may be InGaAs for the electron transfer layer 3, relaxation layer 4, and spacer layer 6, AlInAs for the gate contact layer 5 and etching stopper layer 7, and InP for the cap layer 8.

The present invention has been described in connection with the preferred embodiments. The invention is not limited only to the above embodiments. It is apparent to those skilled in the art that various modifications, improvements, combinations and the like can be made without departing from the scope and spirit of the invention, as defined in the appended claims.

We claim:

1. A semiconductor device comprising:
   a support substrate;
   a carrier transfer layer of compound semiconductor material disposed on or over said support substrate;
   a gate electrode disposed on or over said carrier transfer layer at a partial region thereof;
   a cap layer of non-doped compound semiconductor material disposed on or over said carrier transfer layer at both sides of said gate electrode, said cap layer having a thickness of 100 nm or thicker;
   two current electrodes in ohmic contact with said carrier transfer layer; and
   a gate contact layer of compound semiconductor material having a band gap larger than the band gap of said carrier transfer layer, said gate contact layer being disposed between said carrier transfer layer and said gate electrode;

a spacer layer of non-doped compound semiconductor material disposed between said gate contact layer and said cap layer; and an etching stopper layer disposed between said spacer layer and said cap layer and having a different etching rate from the etching rates of said spacer layer and said cap layer, wherein said gate electrode is disposed in contact with said spacer layer.

2. A semiconductor device according to claim 1, wherein said two current electrodes are formed on said cap layer.

3. A semiconductor device according to claim 1, further comprising two recesses formed at regions corresponding to the regions where said two current electrodes are formed, said two recesses extending from the upper surface of said cap layer to at least the lower surface of said cap layer, and said two current electrode being disposed in said two recesses.

4. A semiconductor device according to claim 3, further comprising two recesses formed at regions corresponding to the regions where said two current electrodes are formed, said two recesses extending from the upper surface of said cap layer to at least the lower surface of said gate contact layer, and said two current electrode being disposed in said two recesses.

5. A semiconductor device according to claim 1, wherein said gate electrode has a side wall facing said cap layer and said cap layer is in contact with the side wall of said gate electrode.

6. A semiconductor device according to claim 1, wherein a distance between said two current electrodes is 4 $\mu$m or shorter.

7. A semiconductor device according to claim 1, further comprising:

a relaxation layer of non-doped compound semiconductor material same as said carrier transfer layer, said relaxation layer being disposed between said carrier transfer layer and said gate contact layer.

8. A semiconductor device according to claim 7, wherein:

said support substrate, said cap layer, and said relaxation layer are made of non-doped GaAs;

said carrier transfer layer is made of GaAs doped with n-type impurities; and said gate contact layer is made of non-doped AlGaAs.

9. A semiconductor device according to claim 7, wherein:

said support substrate and said cap layer are made of non-doped GaAs;

said carrier transfer layer is made of InGaAs doped with n-type impurities;

said gate contact layer is made of non-doped AlGaAs; and said relaxation layer is made of non-doped InGaAs or non-doped GaAs.

10. A semiconductor device according to claim 7, wherein:

said support substrate and said cap layer are made of non-doped InP;

said carrier transfer layer is made of InGaAs doped with n-type impurities;

said gate contact layer is made of non-doped AlInAs; and said relaxation layer is made of non-doped InGaAs.

11. A semiconductor device according to claim 1, wherein:

said support substrate and said cap layer are made of non-doped GaAs;

said carrier transfer layer is made of GaAs doped with n-type impurities; and said gate contact layer is made of non-doped AlGaAs.

12. A semiconductor device according to claim 11, wherein the composition ratio of Al in said gate contact layer is 0.4 to 1.0.

13. A semiconductor device according to claim 1, wherein:

said support substrate, said cap layer, and said spacer layer are made of non-doped GaAs;

said carrier transfer layer is made of GaAs doped with n-type impurities; and said gate contact layer and said etching stopper layer are made of non-doped AlGaAs.

14. A semiconductor device according to claim 1, wherein:

said support substrate and said cap layer are made of non-doped GaAs;

said carrier transfer layer is made of InGaAs doped with n-type impurities; and said gate contact layer is made of non-doped AlGaAs.

15. A semiconductor device according to claim 14, wherein the composition ratio of Al in said gate contact layer is 0.4 to 1.0.

16. A semiconductor device according to claim 1, wherein:

said support substrate, said cap layer, and said spacer layer are made of non-doped GaAs;

said carrier transfer layer is made of InGaAs doped with n-type impurities; and said gate contact layer and said etching stopper layer are made of non-doped AlGaAs.

17. A semiconductor device according to claim 1, wherein:

said support substrate and said cap layer are made of non-doped InP;

said carrier transfer layer is made of InGaAs doped InGaAs with n-type impurities; and said gate contact layer is made of non-doped AlInAs.

18. A semiconductor device according to claim 1, wherein:

said support substrate and said cap layer are made of non-doped InP;

said carrier transfer layer is made of InGaAs doped with n-type impurities; and said gate contact layer and said etching stopper layer are made of non-doped AlInAs.

19. A semiconductor device according to claim 1, wherein a built-in potential at the interface between said gate electrode and said gate contact layer and a thickness and an impurity concentration of said carrier transfer layer are selected so that said carrier transfer layer at the region under said gate electrode is depleted over the whole width thereof under the condition that an external voltage is not applied to said gate electrode.

* * * * *